(12) United States Patent
Chen et al.

(10) Patent No.: US 8,736,079 B2
(45) Date of Patent: May 27, 2014

(54) PAD STRUCTURE, CIRCUIT CARRIER AND INTEGRATED CIRCUIT CHIP

(75) Inventors: Yu-Kai Chen, New Taipei (TW); Yeh-Chi Hsu, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 120 days.

(21) Appl. No.: 13/190,486

(22) Filed: Jul. 26, 2011

(65) Prior Publication Data
US 2012/0299192 A1 Nov. 29, 2012

(30) Foreign Application Priority Data
May 23, 2011 (TW) .............................. 100117982 A

(51) Int. Cl.
*H01L 23/48* (2006.01)
*H01L 23/52* (2006.01)
*H01L 29/40* (2006.01)

(52) U.S. Cl.
USPC .......................................... 257/784; 257/781

(58) Field of Classification Search
USPC ................... 257/780, 781, 701, 778, 784, 786
See application file for complete search history.

(56) References Cited

U.S. PATENT DOCUMENTS

| | | | |
|---|---|---|---|
| 5,923,088 A * | 7/1999 | Shiue et al. | 257/758 |
| 6,414,390 B2 * | 7/2002 | Nozawa | 257/737 |
| 6,552,438 B2 * | 4/2003 | Lee et al. | 257/784 |
| 6,577,017 B1 * | 6/2003 | Wong | 257/786 |
| 7,230,338 B2 * | 6/2007 | Yuzawa et al. | 257/758 |
| 7,470,997 B2 * | 12/2008 | Lin et al. | 257/781 |
| 7,859,122 B2 * | 12/2010 | Daubenspeck et al. | 257/781 |
| 2005/0202221 A1 * | 9/2005 | Wang et al. | 428/209 |
| 2005/0269697 A1 | 12/2005 | Yuzawa et al. | |

FOREIGN PATENT DOCUMENTS

TW 200843067 11/2008

OTHER PUBLICATIONS

"Office Action of Taiwan Counterpart Application", issued on Sep. 11, 2013, p. 1-p. 7.

* cited by examiner

*Primary Examiner* — S. V. Clark
(74) *Attorney, Agent, or Firm* — Jianq Chyun IP Office

(57) ABSTRACT

A pad structure is suitable for a circuit carrier or an integrated circuit chip. The pad structure includes an inner pad, a conductive via and an outer pad. The conductive via connects the inner pad. The outer pad connects the conductive via and further connects a conductive ball or a conductive bump. The outer diameter of the outer pad is greater than the outer diameter of the inner pad.

14 Claims, 6 Drawing Sheets

PAD STRUCTURE, CIRCUIT CARRIER AND INTEGRATED CIRCUIT CHIP

CROSS-REFERENCE TO RELATED APPLICATION

This application claims the priority benefit of Taiwan application serial no. 100117982, filed on May 23, 2011. The entirety of the above-mentioned patent application is hereby incorporated by reference herein and made a part of this specification.

BACKGROUND OF THE INVENTION

1. Field of the Invention

The invention generally relates to a pad structure, and more particularly, to a pad structure used in a circuit carrier or an integrated circuit chip for connecting a conductive ball or a conductive bump.

2. Description of Related Art

In the electronic industry, soldering is a major connecting technology, for example, used for flip chip bonding between a chip and a carrier or connection between a common electronic part and a circuit board. For bonding process, in addition to solder, pad itself and pad surface material, a pad structure plays a critical role to affect bonding reliability.

The multiple functions and miniature of a chip have become a tendency of electronic products, which accordingly requires an increased density of contacts. Under the above-mentioned situation, for some signals with a specific electrical requirement (for example, low impedance, high frequency, coupling sensitivity and the like), the line width and line of the chip need to be increased, which results in a space limitation.

The outer diameter of a pad depends on the and the dimension of soldering balls or bumps and the dimension of solder mask openings. In other words, the outer diameter of a pad greatly depends on the pad structure and thereby determines the distance between two adjacent pads or the layout space of the trace lines, which however is not advantageous for the flexibility of layout design.

When the layout space of the trace lines is not enough, the layout space of the trace lines can be increased by reducing line width and line interval, but it would degrade the electrical performance, for example, causing signal reflection, crosstalk and coupling. Along with the tendency of high density of contacts, the above-mentioned problem becomes more and more serious.

SUMMARY OF THE INVENTION

Accordingly, the invention is directed to a pad structure capable of advancing layout density.

The invention is also directed to a circuit carrier capable of advancing layout density.

The invention is further directed to an integrated circuit chip capable of advancing layout density.

The invention provides a pad structure suitable for a circuit carrier or an integrated circuit chip. The pad structure includes an inner pad, a conductive via and an outer pad. The conductive via connects the inner pad. The outer pad connects the conductive via and further connects a conductive ball or a conductive bump. The outer diameter of the outer pad is greater than the outer diameter of the inner pad.

The invention also provides a circuit carrier, which includes a base layer, an inner circuit layer, a dielectric layer, a first conductive viand a first outer pad. The inner circuit layer is disposed on the base layer and has a first inner pad. The dielectric layer is disposed on the base layer and covers the inner circuit layer. The first conductive via is disposed in the dielectric layer and connects the first inner pad. The first outer pad is disposed on the dielectric layer and connects the first conductive via, in which the outer diameter of the first inner pad is less than the outer diameter of the first outer pad.

The invention further provides an integrated circuit chip, which includes a semiconductor substrate, an integrated circuit layered structure, an inner circuit layer, a dielectric layer, a first conductive via and a first outer pad. The semiconductor substrate has an active surface. The integrated circuit layered structure is disposed on the active surface. The inner circuit layer is disposed on the integrated circuit layered structure and has a first inner pad. The dielectric layer is disposed on the integrated circuit layered structure and covers the inner circuit layer. The first conductive via is disposed in the dielectric layer and connects the first inner pad. The first outer pad is disposed on the dielectric layer and connects the first conductive via, in which the outer diameter of the first inner pad is less than the outer diameter of the first outer pad.

Based on the depiction, the invention makes the outer diameter of the inner pad of the pad structure reduced to advance the layout flexibility of the circuit layer at which the inner pad is located (i.e., inner circuit layer) and thereby advance the layout density or the electrical performance.

Other features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
FIG. 1 is a cross-sectional view of part of a circuit carrier according to an embodiment of the invention.
Figure 2:
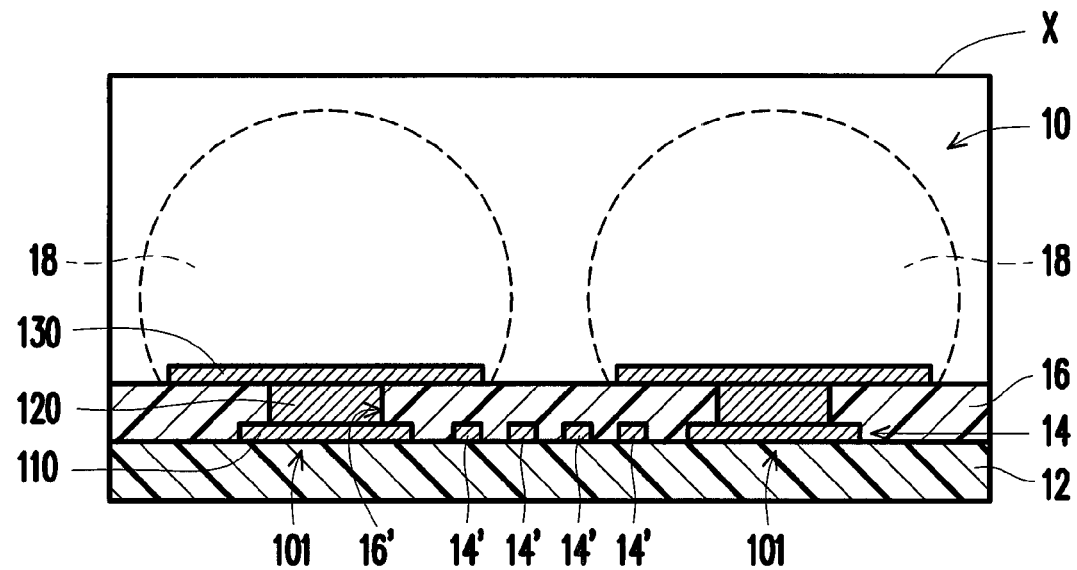
FIG. 2 is an enlarged view of the portion X in FIG. 1.

FIG. 1 is a cross-sectional view of part of a circuit carrier according to an embodiment of the invention and FIG. 2 is an enlarged view of the portion X in FIG. 1. Referring to FIGS. 1 and 2, a circuit carrier 10 of the embodiment includes a base layer 12. The base layer 12 may be a circuit layered structure alternately stacked by a plurality of dielectric resin layers and a plurality of patterned conductive metallic layers, or may be a single material layer. The circuit carrier 10 further includes an inner circuit layer 14 and a dielectric layer 16. The inner circuit layer 14 is a patterned metallic layer and disposed on the base layer 12 and may be a uppermost patterned metallic layer over the base layer 12. The dielectric layer 16 is disposed on the base layer 12 and covers the inner circuit layer 14. In the embodiment, the dielectric layer 16 may be a solder mask layer.

Figure 3:
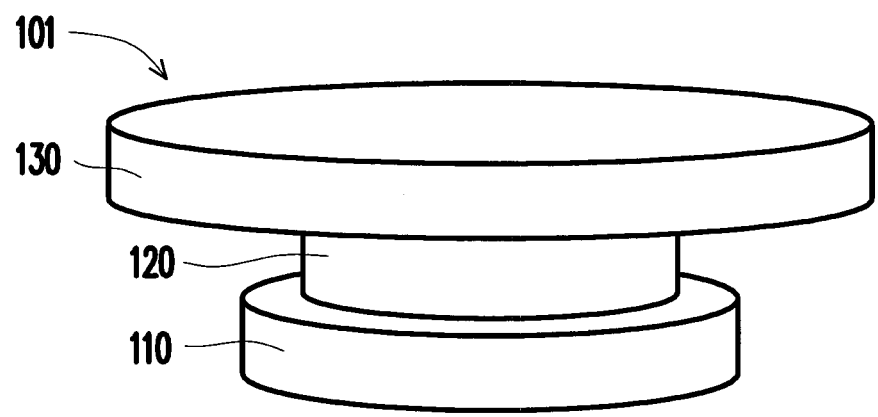
FIG. 3 is a perspective view of the pad structure of FIG. 2.

FIG. 3 is a perspective view of the pad structure of FIG. 2. Referring to FIGS. 2 and 3, the circuit carrier 10 may include a pad structure 101. The pad structure 101 includes an inner pad 110, a conductive via 120 and an outer pad 130. In the embodiment, a portion of the inner circuit layer 14 forms the inner pad 110, the dielectric layer 16 has an opening 16', and the opening 16' exposes the inner pad 110. The conductive via 120 is disposed in the opening 16' and connects the inner pad 110. The outer pad 130 is disposed on the dielectric layer 16 and connects the conductive via 120 so as to provide a larger bonding area to connect a conductive ball or bump 18.

Figure 4:
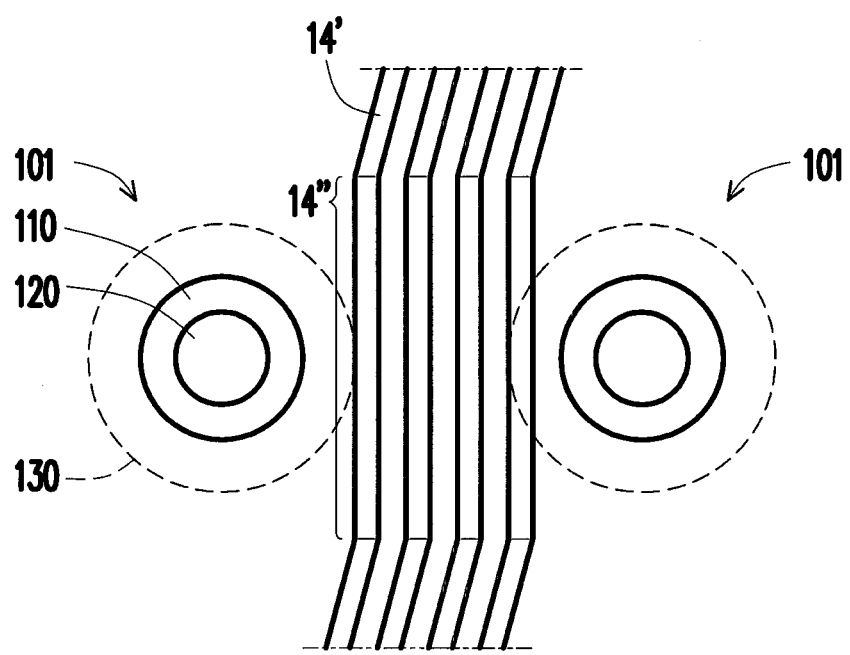
FIG. 4 is a top view showing the two pad structures and a plurality of trace lines in FIG. 2.

FIG. 4 is a top view showing the two pad structures and a plurality of trace lines in FIG. 2, in which the outer pad 130 is shown by dotted line. Referring to FIGS. 2 and 4, in the embodiment, the outer diameter of the inner pad 110 may be less than the outer diameter of the outer pad 130. The design is based on that the opening 16' of the dielectric layer 16 may be formed by laser ablation process. The positioning accuracy of laser is better than the positioning accuracy of traditional printing or photolithography (including exposing and developing) so that the inner pad 110 is unnecessarily designed with a larger dimension to prevent from a larger positioning inaccuracy as the prior art. As a result, the outer diameter of the inner pad 110 may be reduced and the outer diameter of the inner pad 110 may be less than the outer diameter of the outer pad 130.

In comparison with the prior art, under a same condition that the outer pad has a same outer diameter and/or a same density, the invention has a smaller outer diameter of the inner pad 110, which is helpful to advance the layout flexibility of the circuit layer (i.e., the inner circuit layer 14) where inner pads 110 is located so as to advance the layout density or electrical performance. For example, in the embodiment, after the inner pad 110 is reduced, the orthogonal projection of a trace line 14' formed by the inner circuit layer on a geometric plane where the outer pad 130 is located may be overlapped with the outer pad 130.

In the embodiment, the circuit carrier 10 may further include another pad structure 101, the two pad structures 101 are respectively located at both sides of a plurality of trace lines 14'.

Figure 5:
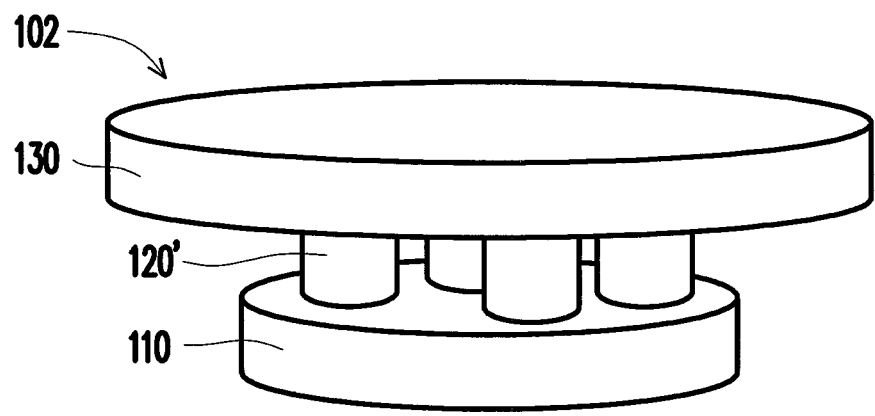
FIG. 5 is a perspective view of a pad structure according to another embodiment of the invention.
Figure 6:
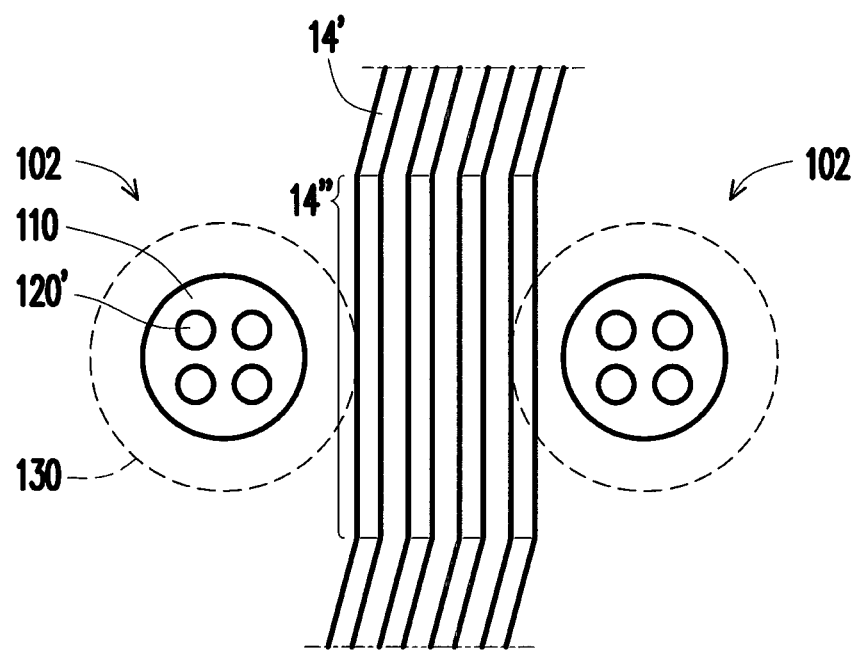
FIG. 6 is a top view showing the two pad structures and a plurality of trace lines in FIG. 5.

FIG. 5 is a perspective view of a pad structure according to another embodiment of the invention, and FIG. 6 is a top view showing the two pad structures and a plurality of trace lines in FIG. 5. Referring to FIGS. 5 and 6, different from the pad structure 101 in FIGS. 3 and 4 where the single conductive via of the pad structure 101 is located between the corresponding inner pad 110 and the corresponding outer pad 130, the pad structure 102 of this embodiment has a plurality of conductive vias 120' simultaneously located between the corresponding inner pad 110 and the corresponding outer pad 130. In addition to four conductive vias 120' in FIGS. 5 and 6, the quantity of the conductive vias 120' may be adjusted according to the area of the inner pad 110 or the outer diameter of the conductive via 120'. In the same way, in the embodiment, the two pad structures 102 are respectively located at both sides of a plurality of trace lines 14' as shown in FIG. 6. It should be noted that the multiple openings of the dielectric layer corresponding to the above-mentioned conductive vias 120' with smaller dimension may be formed by using laser ablation process as well. The conductive vias 120' with smaller dimension may achieve the electrical effect same as one conductive via 120 (FIGS. 3 and 4) with larger dimension.

Figure 7:
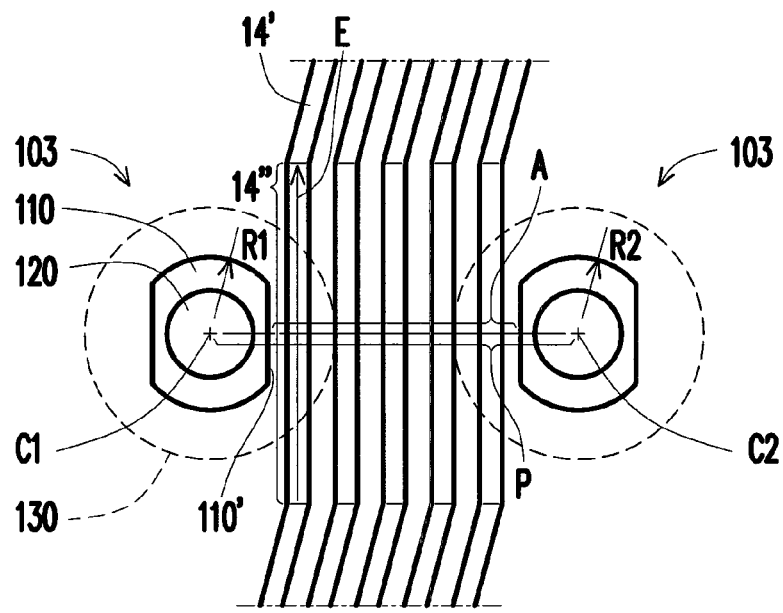
FIG. 7 is a top view showing the two pad structures and a plurality of trace lines according to yet another embodiment of the invention.

FIG. 7 is a top view showing the two pad structures and a plurality of trace lines according to yet another embodiment of the invention. Referring to FIG. 7, in comparison with the embodiment of FIG. 4, the inner pad 110 of the pad structure 103 of the embodiment has a cut edge 110'. The cut edge 110' is towards a segment 14" adjacent thereto, and the cut edge 110' is substantially parallel to an extension direction E of a segment 14" adjacent to the cut edge 110', in which the segment 14" is a portion of the trace line 14. In addition, since the inner pad 110 has the cut edge 110', the inner pad 110 may be made further smaller and the space between two adjacent inner pads 110 may be increased due to the design of the cut edge 110', which are helpful to advance the layout flexibility of the circuit layer where the inner pads 110 are located and the layout density or the electrical performance. For example, under the condition of a same outer diameter and a same density of the outer pad 130, the embodiment of FIG. 4 allows four trace lines disposed between the two inner pads 110, while the embodiment with the design of the cut edge 110' in FIG. 7 allows five trace lines disposed between the two inner pads 110.

Referring to FIG. 7 again, in the embodiment, for the two pad structures 103, the distance between the figure centers C1 and C2 of the two inner pads 110 is P, the largest distance from the figure center C1 of the inner pad 110 at the left side to any point of the profile thereof is R1, the largest distance from the figure center C2 of the inner pad 110 at the right side to any point of the profile thereof is R2, the shortest distance between the profiles of the two inner pads 110 is A, and the difference between P and the summation of R1 and R2 is less than A, i.e., [P−(R1+R2)]<A. However, for the embodiment of FIG. 4 where the inner pad 110 has no cut edge 110', the difference between P and the summation of R1 and R2 is equal to A, i.e., [P−(R1+R2)]=A.

Figure 8:
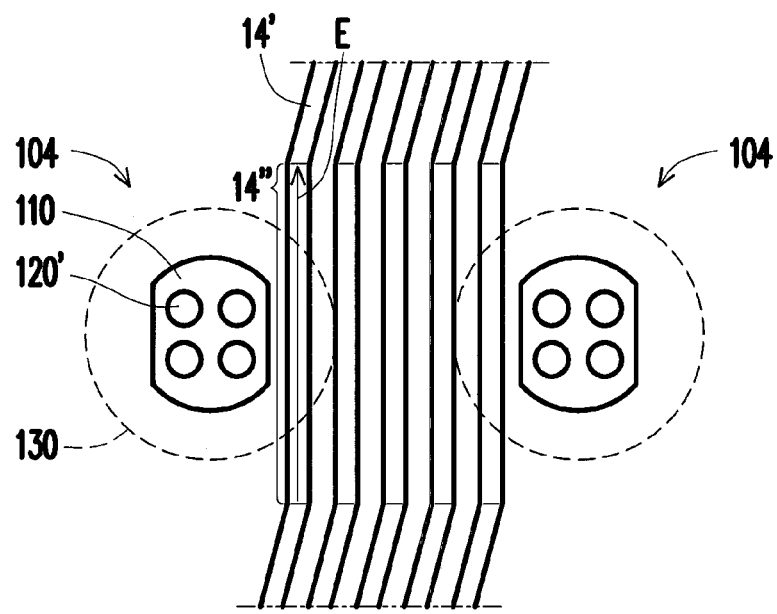
FIG. 8 is a top view showing the two pad structures and a plurality of trace lines according to yet another embodiment of the invention.

FIG. 8 is a top view showing the two pad structures and a plurality of trace lines according to yet another embodiment of the invention. Referring to FIG. 8, in comparison with the embodiment of FIG. 7, each pad structure 104 of the embodiment has a plurality of conductive vias 120' with smaller dimension, and the conductive vias 120' are located between the corresponding inner pad 110 and the corresponding outer pad 130. The conductive vias 120' with smaller dimension may achieve the electrical effect same as one conductive via 120 (FIGS. 3 and 4) with larger dimension.

Figure 9:
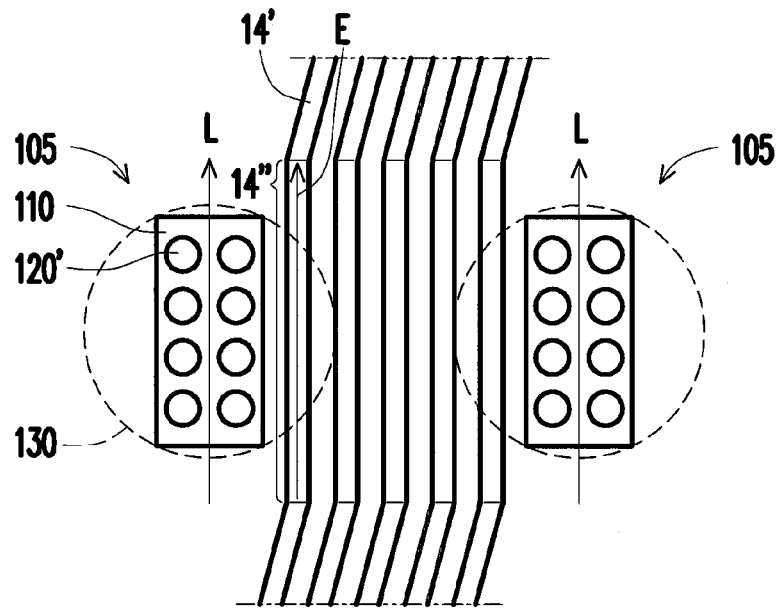
FIG. 9 is a top view showing the two pad structures and a plurality of trace lines according to yet another embodiment of the invention.

FIG. 9 is a top view showing the two pad structures and a plurality of trace lines according to yet another embodiment of the invention. Referring to FIG. 9, in comparison with the embodiment of FIG. 8, the inner pad 110 of each pad structure 105 of the embodiment is in lengthwise shape (for example, rectangular shape or ellipse shape), and the lengthwise directions L of the inner pads 110 is substantially parallel to an extension direction E of a segment 14" adjacent to the inner pad 110a. The design with changing the shape of the inner pad 110, increasing the area of the inner pad 110 and increasing the quantity of the conductive vias 120 is helpful to advance the mechanical strength such as tensile strength or shear strength of the conductive ball or bump 18 (FIG. 2).

Figure 10:
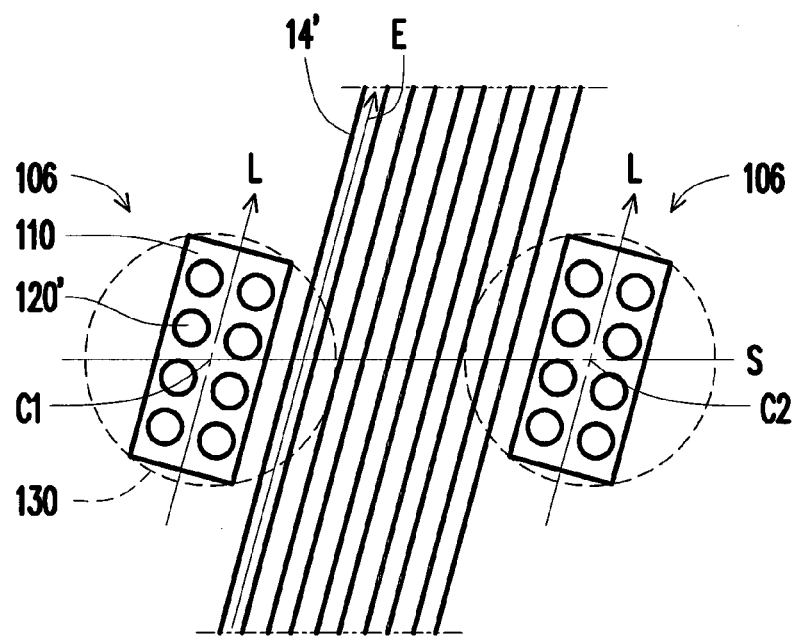
FIG. 10 is a top view showing the two pad structures and a plurality of trace lines according to yet another embodiment of the invention.

FIG. 10 is a top view showing the two pad structures and a plurality of trace lines according to yet another embodiment of the invention. Referring to FIG. 10, in comparison with the embodiment of FIG. 9, the lengthwise direction L of the inner pad 110 of each pad structure 106 in the embodiment has a rotation so as to be parallel to the extension direction E of the trace lines 14', which is helpful to shorten the trace lines 14' and reduce signal reflection. In more details, the lengthwise direction L of the inner pads 110 is inclined to (i.e., non-orthogonal with) a straight line S passing through the figure centers C1 and C2 of the two inner pads.

Figure 11:
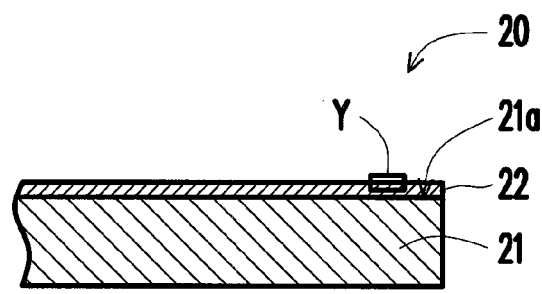
FIG. 11 is a cross-sectional view of part of an integrated circuit chip according to another embodiment of the invention.
Figure 12:
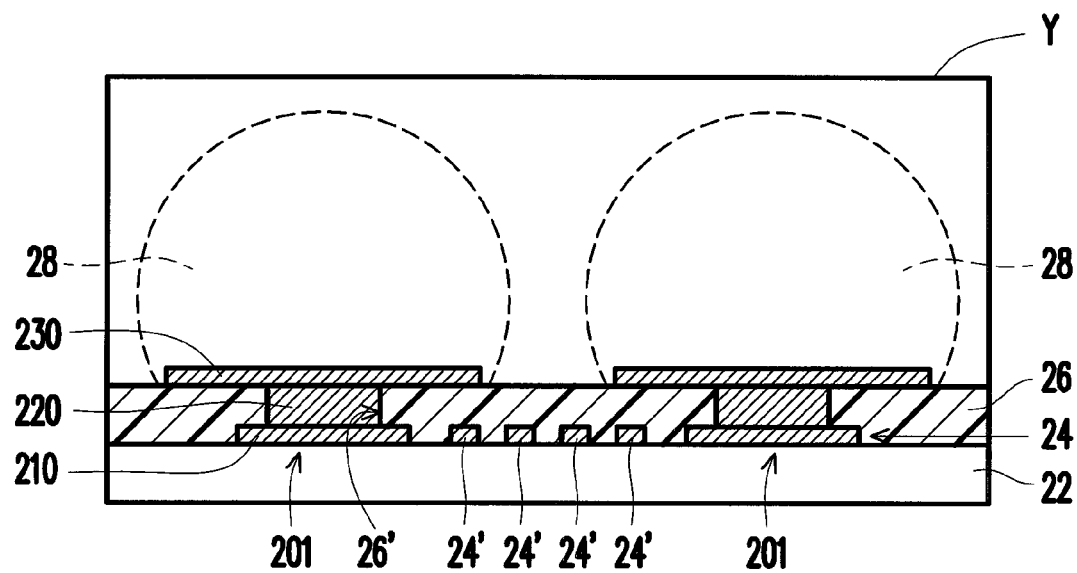
FIG. 12 is an enlarged view of the portion Y in FIG. 11.

FIG. 11 is a cross-sectional view of part of an integrated circuit chip according to another embodiment of the invention, and FIG. 12 is an enlarged view of the portion Y in FIG. 11. Referring to FIGS. 11 and 12, the integrated circuit chip 20 of the embodiment includes a semiconductor substrate 21 and an integrated circuit layered structure 22, in which the semiconductor substrate 21 has an active surface 21a and the integrated circuit layered structure 22 is disposed on the active surface 21a. The integrated circuit layered structure 22 may be composed of a plurality of active devices (for example, transistor), a plurality of passive devices (for example, capacitor or inductor) and a multilevel interconnect structure. The integrated circuit chip 20 further includes an inner circuit layer 24 and a dielectric layer 26, in which the inner circuit layer 24 is disposed on the integrated circuit layered structure 22 and the dielectric layer 26 is disposed on the integrated circuit layered structure 22 and covers the inner circuit layer 24.

Referring to FIG. 12, the integrated circuit chip 20 may include a pad structure 201. The pad structure 201 includes an inner pad 210, a conductive via 220 and an outer pad 230. In the embodiment, a portion of the inner circuit layer 24 forms the inner pad 210, the dielectric layer 26 has an opening 26', and the opening 26' exposes the inner pad 210. The conductive via 220 is disposed in the opening 26' and connects the inner pad 210. The outer pad 230 is disposed on the dielectric layer 26 and connects the conductive via 220 so as to provide a larger bonding area to connect a conductive ball or bump 28. It should be noted that the outer diameter of the inner pad 210 is less than the outer diameter of the outer pad 230. Similarly to the pad structure 101 of the circuit carrier 10 in FIGS. 1 and 2, many variations may derive from the pad structure 201 of the integrated circuit chip 20 in FIGS. 11 and 12, as shown by the embodiments of FIGS. 6-10, which is omitted to be described.

In summary, by means of reducing the outer diameter of the inner pad of the pad structure to increase the layout flexibility of the circuit layer where the inner pad is located (i.e., inner circuit layer), the invention advances the layout density or the electrical performance. In addition, by means of changing the shape of the inner pad, increasing the area of the inner pad and increasing the quantity of the conductive vias, the invention advances the mechanical strength such as tensile strength or shear strength of the conductive ball or the conductive bump bonded by the outer pad.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A pad structure, suitable for a circuit carrier or an integrated circuit chip, the pad structure comprising:
   a first inner pad;
   a second inner pad;
   a first conductive via connecting the first inner pad;
   a first outer pad connecting the first conductive via and suitable to connect a conductive ball or a conductive bump, wherein the outer diameter of the first outer pad is greater than the outer diameter of the first inner pad;
   a second conductive via connecting the second inner pad; and
   a second outer pad connecting the second conductive via, wherein the outer diameter of the second outer pad is greater than the outer diameter of the second inner pad, the distance between the figure center of the first inner pad and the figure center of the second inner pad is P, the largest distance from the figure center of the first inner pad to any point of the profile thereof is R1, the largest distance from the figure center of the second inner pad to any point of the profile thereof is R2, the shortest distance between the profile of the first inner pad and the profile of the second inner pad is A, and the difference between P and the summation of R1 and R2 is less than A, i.e., $[P-(R1+R2)]<A$.

2. The pad structure as claimed in claim 1, further comprising:
   a plurality of first conductive vias located between the first inner pad and the first outer pad and connecting the first inner pad and the first outer pad.

3. The pad structure as claimed in claim 1, wherein the shape of the first inner pad has a cut edge.

4. The pad structure as claimed in claim 1, wherein the first inner pad is in lengthwise shape.

5. A circuit carrier, comprising:
   a base layer;
   an inner circuit layer disposed on the base layer and having a first inner pad;
   a dielectric layer disposed on the base layer and covering the inner circuit layer;
   a first conductive via disposed in the dielectric layer and connecting the first inner pad;
   a first outer pad disposed on the dielectric layer and connecting the first conductive via, wherein the outer diameter of the first inner pad is less than the outer diameter of the first outer pad;
   a second conductive via; and
   a second outer pad, wherein the inner circuit layer further has a second inner pad, the second conductive via is disposed in the dielectric layer and connects the second inner pad, the second outer pad connects the second conductive via and the outer diameter of the second outer pad is greater than the outer diameter of the second inner pad, wherein the distance between the figure center of the first inner pad and the figure center of the second inner pad is P, the largest distance from the figure center of the first inner pad to any point of the profile thereof is R1, the largest distance from the figure center of the second inner pad to any point of the profile thereof is R2, the shortest distance between the profile of the first inner pad and the profile of the second inner pad is A, and the difference between P and the summation of R1 and R2 is less than A, i.e., $[P-(R1+R2)]<A$.

6. The circuit carrier as claimed in claim 5, wherein the inner circuit layer further has a trace line, the first outer pad is located on a geometric plane, and an orthogonal projection of the trace line on the geometric plane is overlapped with the first outer pad.

7. The circuit carrier as claimed in claim 5, wherein the inner circuit layer further has a trace line, the first inner pad has a first straight edge, the first straight edge is towards a segment adjacent to the first straight edge, the first straight edge is substantially parallel to the extension direction of the segment, and the segment is a portion of the trace line.

8. The circuit carrier as claimed in claim 5, wherein the inner circuit layer further has a trace line, the first inner pad is in lengthwise shape, the lengthwise direction of the first inner pad is substantially parallel to the extension direction of a segment adjacent to the first inner pad, and the segment is a portion of the trace line.

9. The circuit call carrier as claimed in claim 5, wherein the inner circuit layer further has a trace line, the first inner pad and the second inner pad are in lengthwise shape, the lengthwise direction of the first inner pad is substantially parallel to the extension direction of a segment adjacent to the first inner pad, the lengthwise direction of the second inner pad is substantially parallel to the extension direction of the segment, the lengthwise direction of the first inner pad and the lengthwise direction of the second inner pad are inclined to a straight line passing through the figure center of the first inner pad and the figure center of the second inner pad, and the segment is a portion of the trace line.

10. An integrated circuit chip, comprising:
    a semiconductor substrate having an active surface;
    an integrated circuit layered structure disposed on the active surface;
    an inner circuit layer disposed on the integrated circuit layered structure and having a first inner pad;
    a dielectric layer disposed on the integrated circuit layered structure and covering the inner circuit layer;
    a first conductive via disposed in the dielectric layer and connecting the first inner pad;
    a first outer pad disposed on the dielectric layer and connecting the first conductive via, wherein the outer diameter of the first inner pad is less than the outer diameter of the first outer pad;
    a second conductive via; and
    a second outer pad, wherein the inner circuit layer further has a second inner pad, the second conductive via is disposed in the dielectric layer and connects the second inner pad, the second outer pad connects the second conductive via and the outer diameter of the second outer pad is greater than the outer diameter of the second inner pad, wherein the distance between the figure center of the first inner pad and the figure center of the second inner pad is P, the largest distance from the figure center of the first inner pad to any point of the profile thereof is R1, the largest distance from the figure center of the second inner pad to any point of the profile thereof is R2, the shortest distance between the profile of the first inner pad and the profile of the second inner pad is A, and the difference between P and the summation of R1 and R2 is less than A, i.e., $[P-(R1+R2)]<A$.

11. The integrated circuit chip as claimed in claim 10, wherein the inner circuit layer further has a trace line, and the orthogonal projection of the trace line on a geometric plane where the first outer pad is located is overlapped with the first outer pad.

12. The integrated circuit chip as claimed in claim 10, wherein the inner circuit layer further has a trace line, the first inner pad has a first cut edge, the first cut edge is towards a segment adjacent to the first cut edge, the first cut edge is substantially parallel to the extension direction of the segment, and the segment is a portion of the trace line.

13. The integrated circuit chip as claimed in claim 10, wherein the inner circuit layer further has a trace line, the first inner pad is in lengthwise shape, the lengthwise direction of the first inner pad is substantially parallel to the extension direction of a segment adjacent to the first inner pad, and the segment is a portion of the trace line.

14. The integrated circuit chip as claimed in claim 10, wherein the inner circuit layer further has a trace line, the first inner pad and the second inner pad are in lengthwise shape, the lengthwise direction of the first inner pad is substantially parallel to the extension direction of a segment adjacent to the first inner pad, the lengthwise direction of the second inner pad is substantially parallel to the extension direction of the segment, the lengthwise direction of the first inner pad and the lengthwise direction of the second inner pad are inclined to a straight line passing through the figure center of the first inner pad and the figure center of the second inner pad, and the segment is a portion of the trace line.

* * * * *